United States Patent
Hu (10) Patent No.: US 11,442,093 B2
(45) Date of Patent: Sep. 13, 2022

(54) MINIATURIZED HORN ANTENNA SUITABLE FOR ULTRA-WIDEBAND MEASUREMENT

(71) Applicant: Nan Hu, Irvine, CA (US)

(72) Inventor: Nan Hu, Beijing (CN)

(73) Assignee: Nan Hu, Beijing (CN)

( * ) Notice: Subject to any disclaimer, the term of this patent is extended or adjusted under 35 U.S.C. 154(b) by 106 days.

(21) Appl. No.: 17/172,102

(22) Filed: Feb. 10, 2021

(65) Prior Publication Data
US 2021/0255227 A1    Aug. 19, 2021

(30) Foreign Application Priority Data
Feb. 19, 2020   (CN) .......................... 202020182917.9

(51) Int. Cl.
*G01R 29/08* (2006.01)
*H01Q 13/02* (2006.01)
*H01Q 5/25* (2015.01)

(52) U.S. Cl.
CPC ..... *G01R 29/0878* (2013.01); *H01Q 13/0275* (2013.01); *H01Q 5/25* (2015.01)

(58) Field of Classification Search
CPC combination set(s) only.
See application file for complete search history.

(56) References Cited

U.S. PATENT DOCUMENTS

| | | | |
|---|---|---|---|
| 2005/0078044 A1* | 4/2005 | Rodriguez | H01Q 13/0275 343/786 |
| 2015/0002354 A1* | 1/2015 | Knowles | H01Q 13/0283 343/908 |
| 2021/0305708 A1* | 9/2021 | Hu | H01Q 13/025 |

FOREIGN PATENT DOCUMENTS

CN        206148621 U  *  5/2017

OTHER PUBLICATIONS

English Translation of the Chinese patent application_ Hu, Nan CN 206148621 U (Year: 2017).*

* cited by examiner

*Primary Examiner* — Jermele M Hollington
*Assistant Examiner* — Suresh K Rajaputra
(74) *Attorney, Agent, or Firm* — Gang Yu (57) ABSTRACT

Some embodiments of the present disclosure provide a miniaturized horn antenna suitable for ultra-wideband measurement, and relates to the technical field of horn antennas. The antenna includes a horn antenna body, a coaxial connector and a mounting base, wherein the horn antenna body includes an upper plate, a lower plate, a side plate and a cover plate which are provided with ridges, mounting seats being formed on front and rear sides of an upper half cavity and a lower half cavity, several threaded holes being provided in the mounting seats separately, an upper mounting groove and a lower mounting groove being formed between the mounting seats of the upper plate and between the mounting seats of the lower plate respectively, the upper mounting groove and the lower mounting groove jointly forming a mounting space of a protrusion part at a left end of the cover plate.

20 Claims, 8 Drawing Sheets

MINIATURIZED HORN ANTENNA SUITABLE FOR ULTRA-WIDEBAND MEASUREMENT

CROSS-REFERENCE TO RELATED APPLICATIONS

The present disclosure claims priority to Chinese Patent Application No. 202020182917.9 (application publication number CN211295395 U), filed on Feb. 19, 2020 and entitled "Miniaturized Horn Antenna Suitable for Ultra-Wideband Measurement", the contents of which are hereby incorporated by reference in its entirety.

TECHNICAL FIELD

The present disclosure relates to a technical field of horn antennas, and in particular to a miniaturized horn antenna suitable for ultra-wideband measurement.

BACKGROUND

With a fifth generation mobile communication system (5G) rapidly developed, spectrum application has begun to expand to a millimeter wave band, and related devices and application scenarios are increasingly mature. As an important test device, vector network analyzers with an operating frequency up to 110 GHz are increasingly popular, A continuous commercialization of products operating in a millimeter wave band, such as reversing radar, millimeter wave medical treatment and security inspection technology, promotes popularization of flexible cable components operating in a frequency band of 110 GHz on a market. Devices with 1.0 mm connectors provide coaxial interfaces for wideband and millimeter wave systems, thereby reducing a complexity and improving performance and repeatability, so as to obtain a better measurement result.

SUMMARY

Some embodiments of the present disclosure provide a miniaturized horn antenna, which has a good gain characteristic and standing wave characteristic while realizing an ultra-wideband.

In order to solve the above-mentioned technical problem, some embodiments of the present disclosure uses the technical solutions as follows: a miniaturized horn antenna suitable for ultra-wideband measurement includes a horn antenna body, a coaxial connector and a mounting base, wherein the horn antenna body includes an upper plate, a lower plate, a side plate and a cover plate, the upper plate and the lower plate are provided with ridges, the upper plate and the lower plate being in a symmetrical structure integrally and integrally formed separately, and both the upper plate and the lower plate include left parts and right parts, a right part of the upper plate and a right part of the lower plate form an upper half cavity respectively, the upper half cavity and the lower half cavity form an entire excitation cavity; the miniaturized horn antenna further include mounting seats formed on front and rear sides of the upper half cavity and the lower half cavity, wherein at least one a first threaded holes is provided in the mounting seats separately, each of the at least one first threaded holes is penetrated through a corresponding mounting seat, at least one pin holes is provided in a mounting seat disposed on the upper plate and a mounting seat disposed on the lower plate separately, an upper mounting groove is formed between the mounting seats disposed one the upper plate and the upper plate, a lower mounting groove is formed between the mounting seats disposed on the lower plate respectively, the upper mounting groove and the lower mounting groove jointly form a mounting space for arranging a protrusion part at a left end of the cover plate, the protrusion part is mounted in the mounting space, the cover plate is fixedly connected with right side surfaces of the upper plate and the lower plate, the left parts of the upper plate and the lower plate are in a trapezoidal structure integrally, widths of the left parts are gradually reduced from left to right, the left parts of the upper plate and the lower plate are provided with vertically-disposed curved ridges in an axial direction of an antenna, a height of the curved ridge is gradually reduced from left to right, at least one side plates is disposed between a front side of the upper plate and a front side of the lower plate and between a rear side of the upper plate and a rear side of the lower plate, an upper end of each of the at least one side plates is fixedly connected with the upper plate, and a lower end of each of the at least one side plate is fixedly connected with the lower plate; the coaxial connector is fixedly connected with the upper plate; and the mounting base fixes the cover plate on the upper plate and the lower plate.

In some embodiments, the upper mounting groove and the lower mounting groove include a first mounting grooves located on a left side and a second mounting grooves located on a right side respectively, a width of the first mounting groove is smaller than a width of the second mounting groove; the cover plate includes the protrusion part located on the left side and a connection part located on the right side, the protrusion part include a first protrusion located on the left side and a second protrusion located on the right side, the upper first mounting groove of the upper mounting groove and the first mounting groove of the lower mounting groove form a mounting space for accommodating the first protrusion, the second mounting groove of the upper mounting groove and the lower second mounting groove of the lower mounting groove form a mounting space of the second protrusion, and front and rear sides of the connection part are provided with at least one second threaded holes; and positions, corresponding to the second threaded holes in the connection part, in the mounting base are also provided with third threaded holes, and a bolt is passed through each of the third threaded holes in the mounting base and the at least one second threaded hole in the connection part in sequence to fix the cover plate to the upper plate and the lower plate.

In some embodiments, a first central hole penetrating upper and lower sides of the upper plate is provided in one end, close to the mounting seat, of the curved ridge located on the upper plate, a second central hole penetrating upper and lower sides of the lower plate is provided in one end, close to the mounting seat, of the curved ridge located on the lower plate, the first central hole and the second central hole are oppositely disposed, one end of the coaxial connector is fixed on the upper plate and covers an opening in an upper end of the first central hole and a second central column located in the second central hole, wherein the first central column is located in the first central hole and a second central column located in the second central hole, wherein the first central column is not in contact with an inner wall of the first central hole, an upper end of the first central column is electrically connected with the coaxial connector, an upper end of the second central column is in contact with a lower end of the first central column, and a lower end of the second central column is fixed in the second central hole.

In some embodiments, the second central hole includes an upper second central hole and a lower second central threaded hole, a diameter of the upper second central hole is smaller than a diameter of the lower second central threaded hole, and the second central column includes an upper second central column and a lower second central threaded column, the upper second central column is cooperated with the upper second central hole, the lower second central threaded column is cooperated with the lower second central threaded hole, an upper end of the upper second central column is in direct contact with the lower end of the first central column, and a lower surface of the lower second central threaded column is provided with a slotted groove.

In some embodiments, a diameter of the first central column is less than 0.5 mm and a diameter of the second central hole is less than 1 mm.

As a further technical solution, a ridge curve of the curved ridge is satisfied a curve equation: $y=10^{(a*x+b)}+c*x$, y is a height of the ridge, x is a length of the ridge, and a, b and c are constants.

In some embodiments, a value range of a is (0, 0.2), a value range of b is (−2, 0) and a value range of c is (0, 0.005).

In some embodiments, front and rear sides of a left part of the upper plate are provided with bosses extending outwards, and front and rear side surfaces, connected with the bosses, of the upper plate are provided with at least one fourth threaded holes separately; front and rear sides of a left part of the lower plate are provided with bosses extending outwards, and front and rear side surfaces, connected with the bosses, of the lower plate are provided with at least one fourth threaded holes separately; and the side plate is mounted with an aid of the fourth threaded hole.

In some embodiments, an entire length of the horn antenna is 65 mm, a diameter of the mounting base is 41 mm and a size of a horn opening is 19 mm*20 mm.

In some embodiments, a range of operating frequencies of the antenna is 10 GHz-110 GHz.

Some embodiments of the present disclosure provided a horn antenna, including: a horn antenna body; a coaxial connector; and a mounting base, wherein the horn antenna body comprises an upper plate, a lower plate, a side plate, a cover plate and mounting seats; mounting seats are formed on front and rear sides of the upper half cavity and the lower half cavity; wherein, an excitation cavity is disposed on ends, close to the cover plate, of the upper plate and the lower plate; mounting seats are disposed on ends, close to the cover plate, of the upper plate and the lower plate; an upper mounting groove is disposed on the upper plate and the mounting seat disposed on the upper plate; an lower mounting groove is disposed on the lower plate and the mounting seat disposed on the lower plate; a protrusion part is disposed on the cover plate, the upper mounting groove and the lower upper mounting groove form a mounting space, the protrusion part is disposed in the mounting space.

In some embodiments, the upper plate and the lower plate are provided with vertically-disposed curved ridges; a height of the curved ridge is gradually increased along a direction away from the cover plat.

In some embodiments, wherein each of the mounting seats is provided with a first threaded hole, the first threaded hole is penetrated through a corresponding mounting seat, each of the mounting seats is provided with a pin hole.

In some embodiments, wherein both opposite sides of the upper plate and the lower plate are provided with a side plate, an upper end of the side plate is fixedly connected with the upper plate, and a lower end of the side plate is fixedly connected with the lower plate.

In some embodiments, wherein the upper mounting groove and the lower mounting groove comprise a first mounting groove and a second mounting groove respectively, the first mounting groove is located on one side, away from the cover plate, of the second mounting groove, a width of the first mounting groove is smaller than a width of the second mounting groove; the protrusion part comprises a first protrusion and a second protrusion, the first mounting groove of the upper mounting groove and the first mounting groove of the lower mounting groove form a mounting space for accommodating the first protrusion; the second mounting groove of the upper mounting groove and the second mounting groove of the lower mounting groove form a mounting space for accommodating the second protrusion.

In some embodiments, wherein the cover plate comprises the protrusion part and a connection part, the protrusion part is connected with the connection part, the protrusion part is located one side, close to the upper plate, of the connection part; the upper plate is provided with an upper half cavity, the lower plate is provided with a lower half cavity, an excitation cavity comprises the upper half cavity and the lower half cavity; a end surface, close to the upper plate, of the protrusion part, is a part of an inner wall surface of the excitation cavity.

In some embodiments, wherein a ridge curve of the curved ridge is satisfied a curve equation: $y=10^{(a*x+b)}+c*x$, y is a height of the ridge, x is a length of the ridge, and a, b and c are constants.

In some embodiments, wherein a value range of a is (0, 0.2), a value range of b is (−2, 0) and a value range of c is (0, 0.005).

In some embodiments, wherein each of the upper plate and the lower plate comprises a trapezoidal structure, a width of the trapezoidal structure are gradually increased along a direction away from the cover plate.

In some embodiments, wherein an entire length of the horn antenna is 65 mm, a diameter of the mounting base is 41 mm and a size of a horn opening is 19 mm*20 mm.

The beneficial effects of some embodiments of the present disclosure lie in that the antenna has a simple and compact structure, is miniaturized and effectively saves on a space; a 1.0 mm coaxial connector is used, such that impedance matching design is optimized, and an ultra-wide antenna bandwidth is realized; and the antenna has the characteristics of a high gain, a low standing wave and high cross polarization isolation.

BRIEF DESCRIPTION OF THE DRAWINGS

The present disclosure is further described in detail below with reference to accompanying drawings and specific implementation.

wherein 1. coaxial connector, 2. mounting base, 3. upper plate, 4. lower plate, 5. side plate, 6. cover plate, 7. mounting seat, 81. first threaded hole, 82. second threaded hole, 83. fourth threaded hole, 9. pin hole, 10. curved ridge, 11. first mounting groove, 12. second mounting groove, 13. connection part, 14. first protrusion, 15. second protrusion, 16. first central column, 17. second central column, 18. upper second central column, 19. lower second central threaded column, and 20. boss, 30, excitation cavity.

DETAILED DESCRIPTION OF THE EMBODIMENTS

The technical solutions of embodiments of the present disclosure are described below clearly and comprehensively with reference to accompanying drawings in the embodiments of the present disclosure. It is obvious that the embodiments described are merely a part of embodiments of the present disclosure, instead of all embodiments. On the basis of the embodiments of the present disclosure, all other embodiments obtained by those of ordinary skill in the art without making inventive efforts fall within the scope of protection of the present disclosure.

Many specific details are set forth in the following description to facilitate full understanding of the present disclosure, but the present disclosure may also be implemented in other ways different from those described herein, similar derivatives may be made by those skilled in the art without departing from the connotation of the present disclosure, and therefore, the present disclosure is not limited by the specific embodiments disclosed below.

As shown in FIGS. 1-4, 13 and 14, the embodiments of the present disclosure disclose a miniaturized horn antenna suitable for ultra-wideband measurement, wherein the antenna have a range of operating frequencies of 10 GHz-110 GHz and includes a horn antenna body, a coaxial connector 1 and a mounting base 2, a total length of the antenna provided by the present specific embodiment is 65 mm or so, a diameter of the mounting base is 41 mm, a size of a horn opening is 19 mm*20 mm, a total weight is 0.1 kg or so, and the antenna has a compact, small and light structure. In some embodiments, the horn antenna body includes an upper plate 3, a lower plate 4, a side plate 5 and a cover plate 6, the upper plate and the lower plate are provided with ridges, the upper plate 3 and the lower plate 4 are in a symmetrical structure integrally and integrally formed separately, and both the upper plate and the lower plate include left parts and right parts, a right part of the upper plate 3 and a right part of the lower plate 4 form an upper half cavity and a lower half cavity respectively, the upper half cavity and the lower half cavity form an entire excitation cavity, the miniaturized horn antenna further includes mounting seats 7 formed on front and rear sides of the upper half cavity and the lower half cavity, wherein at least one a first threaded holes 81 is provided in the mounting seats 7 separately, each of the at least one first threaded hole 81 is penetrated through a corresponding the mounting seat 7, at least one pin hole 9 is provided in a mounting seat disposed on the upper plate 3 and a mounting seat disposed on the lower plate 4 separately, a positioning pin is arranged in the pin hole 9 and configured to position the upper plate 3 and the lower plate 4 to facilitate mounting between the upper plate and the lower plate, an upper mounting groove is formed between the upper plate 3 and a mounting seat 7 disposed on the upper mounting groove, and a lower mounting groove is formed between the lower plate 4 and the mounting seat 7 disposed on the lower plate 4 respectively, the upper mounting groove and the lower mounting groove jointly form a mounting space of a protrusion part at a left end of the cover plate 6, the protrusion part is mounted in the mounting space. In this way, a distance between the projection part and an axis of the coaxial connector 1 can be adjusted by abrading an end of the projection part near the excitation cavity, so as to adjust an impedance matching, obtain an ideal standing wave characteristic, and achieve an effect of improving an gain characteristic in a high frequency direction.

In addition, by trimming connecting surfaces between the upper half cavity and the lower half cavity, a distance between the curved ridge 10 located on the upper plate 3 and the curved ridge 10 located on the lower plate 4 can be adjusted, so that the impedance matching can be adjusted and optimized.

The cover plate 6 is fixedly connected with right side surfaces of the upper plate 3 and the lower plate 4, the left parts of the upper plate 3 and the lower plate 4 is in a trapezoidal structure integrally, widths of the left parts are gradually reduced from left to right, the left parts of the upper plate 3 and the lower plate 4 are provided with vertically-disposed curved ridges 10 in an axial direction of the antenna, a height of the curved ridge 10 is gradually reduced from left to right, in some embodiments, a ridge curve of the curved ridge 10 is satisfied a curve equation: $y=10^{\wedge}(a*x+b)+c*x$, y is the height of the ridge, x is a length of the ridge, a, b and c are constants, a value range of a is (0, 0.2), a value range of b is (−2, 0) and a value range of c is (0, 0.005), side plates 5 are disposed between a front side of the upper plate 3 and a front side of the lower plate 4 and between a rear side of the upper plate 3 and a rear side of the lower plate 4, an upper end of the side plate 5 is fixedly connected with the upper plate 3, and a lower end of the side plate 5 is fixedly connected with the lower plate 4; the coaxial connector 1 is fixedly connected with the upper plate 3; and the mounting base 2 fixes the cover plate 6 to the upper plate 3 and the lower plate 4.

As shown in FIGS. 5-8, the upper mounting groove and the lower mounting groove include first mounting grooves 11 located on a left side and second mounting grooves 12 located on a right side, a width of the first mounting groove 11 is smaller than a width of the second mounting groove 12; the cover plate 6 includes the protrusion part located on the left side and a connection part 13 located on the right side, the protrusion part includes a first protrusion 14 located on the left side and a second protrusion 15 located on the right side, an upper first mounting groove and a lower first mounting groove form a mounting space for accommodating the first protrusion 14, an upper second mounting groove and a lower second mounting groove form a mounting space for accommodating the second protrusion 15, and front and rear sides of the connection part 13 are provided with at least one second threaded hole 82; and positions, corresponding to the second threaded hole 82 in the connection part 13, in the mounting base 2 are also provided with third threaded holes, and a bolt is passed through each of the third threaded holes in the mounting base 2 and the at least one second threaded hole in the connection part 13 in sequence to fix the cover plate 6 to the upper plate 3 and the lower plate 4.

As shown in FIGS. 5-8, a first central hole penetrating upper and lower sides of the upper plate 3 is provided in one end, close to the mounting seat 7, of the curved ridge 10 of the upper plate 3, a second central hole penetrating upper and lower sides of the lower plate 4 is provided in one end, close to the mounting seat 7, of the curved ridge 10 of the lower plate 4, the first central hole and the second central hole are oppositely disposed, one end of the coaxial connector 1 is fixed on the upper plate 3 and covers an opening in an upper end of the first central hole, a first central column 16 is located in the first central hole, the first central column 16 is not in contact with an inner wall of the first central hole, an upper end of the first central column is electrically connected with the coaxial connector 1, and a second central column 17 is located in the second central hole, an upper end of the second central column 17 is in contact with a lower end of the first central column 16, and a lower end of the second central column 17 is fixed in the second central hole.

Figure 7:
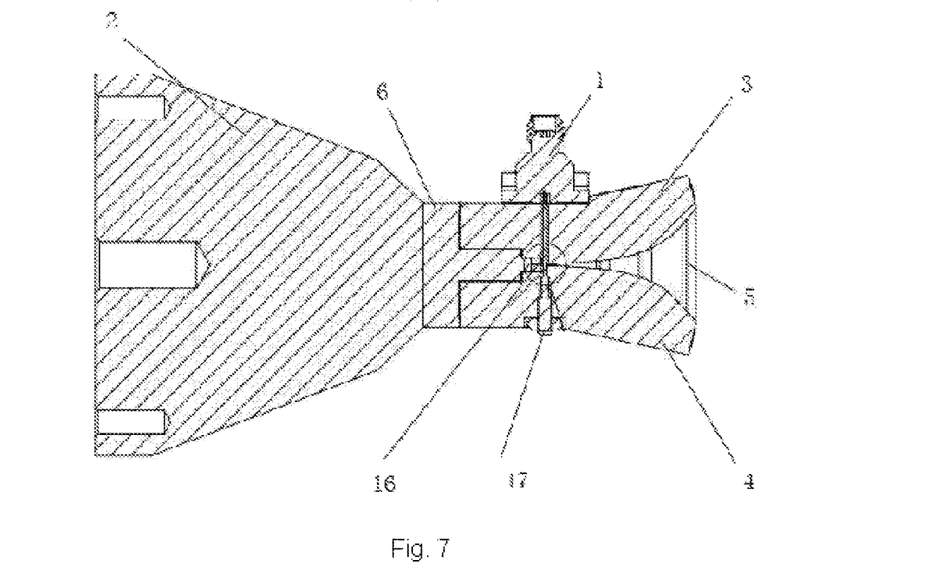
FIG. 7 illustrates a section-view structural schematic diagram of the horn antenna of the embodiments of the present disclosure.
Figure 8:
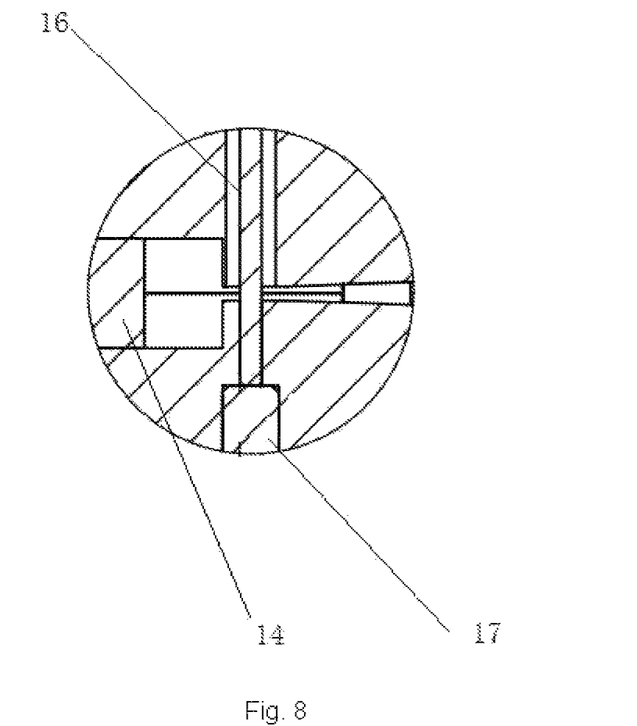
FIG. 8 illustrates a structural schematic diagram of partially-enlarged FIG. 7.

In some embodiments, as shown in FIGS. 7-8, the second central hole includes an upper second central hole and a lower second central threaded hole, a diameter of the upper second central hole being smaller than that of the lower second central threaded hole, and the second central column includes an upper second central column 18 and a lower second central threaded column 19, the upper second central column 18 is cooperated with the upper second central hole, the lower second central threaded column 19 is cooperated with the lower second central threaded hole, an upper end of the upper second central column 18 is in direct contact with the lower end of the first central column 16, and a lower surface of the lower second central threaded column 19 is provided with a slotted groove. In some embodiments, the first central column 16 has a diameter less than 0.5 mm and the second central hole has a diameter less than 1 mm. A lower section of the second central column is thickened and provided with a thread, a top end of the lower section is in a slotted shape, such that an insertion depth can be adjusted, so as to adjust impedance matching between a coaxial line and the ridge. The first central column and the second central column are fixed with glue after adjusted, and meanwhile, the first central column is fixed with a nut on the lower plate 2 and glued to prevent looseness.

Figure 1:
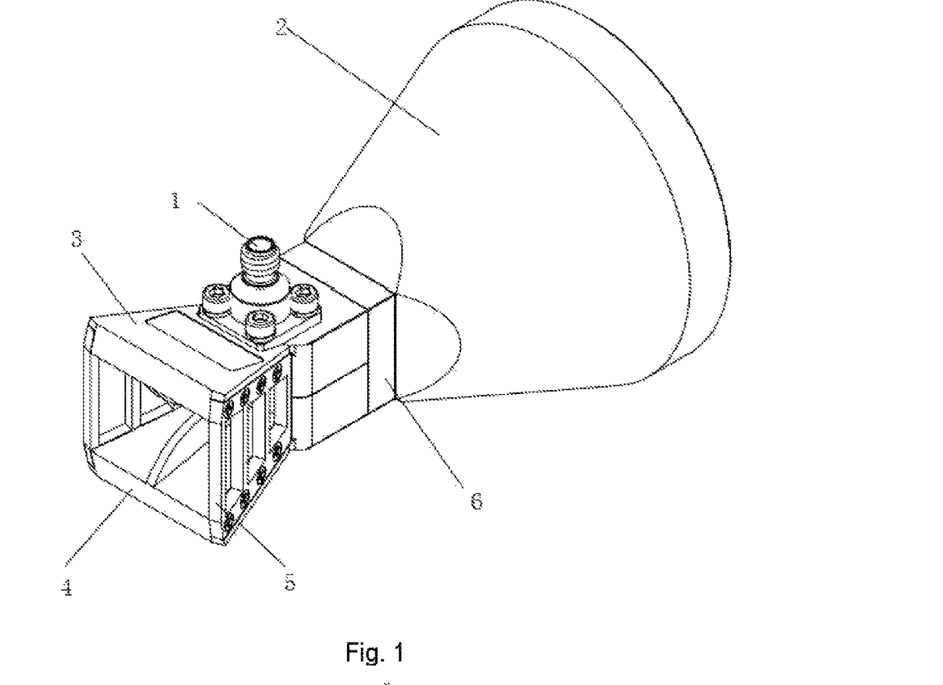
FIG. 1 illustrates a perspective structural schematic diagram of a horn antenna of embodiments of the present disclosure.
Figure 2:
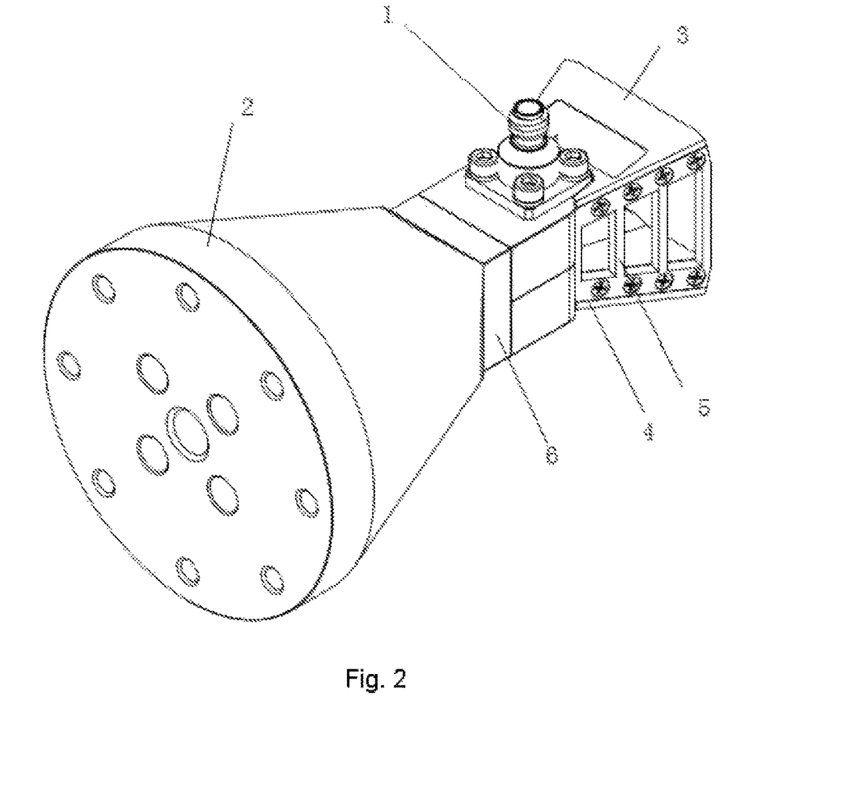
FIG. 2 illustrates a perspective structural schematic diagram of a horn antenna of the embodiments of the present disclosure.
Figure 3:
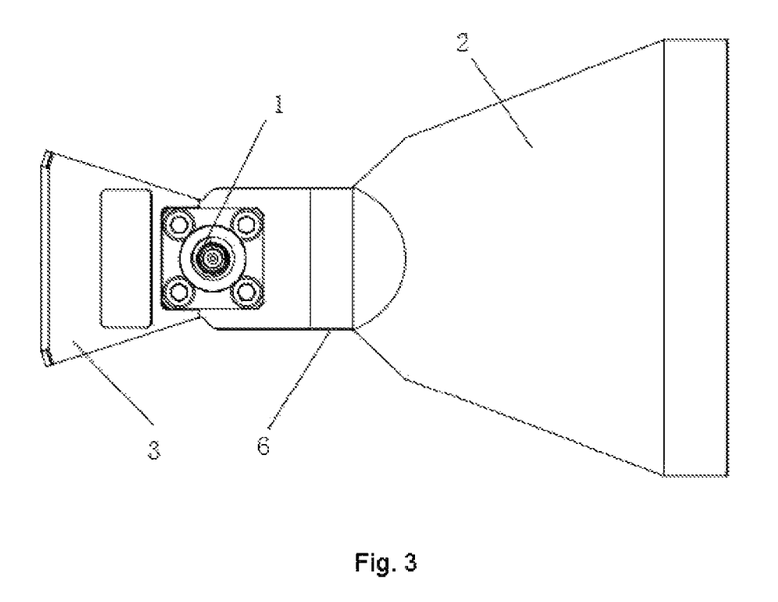
FIG. 3 illustrates a top-view structural schematic diagram of a horn antenna of the embodiments of the present disclosure.
Figure 4:
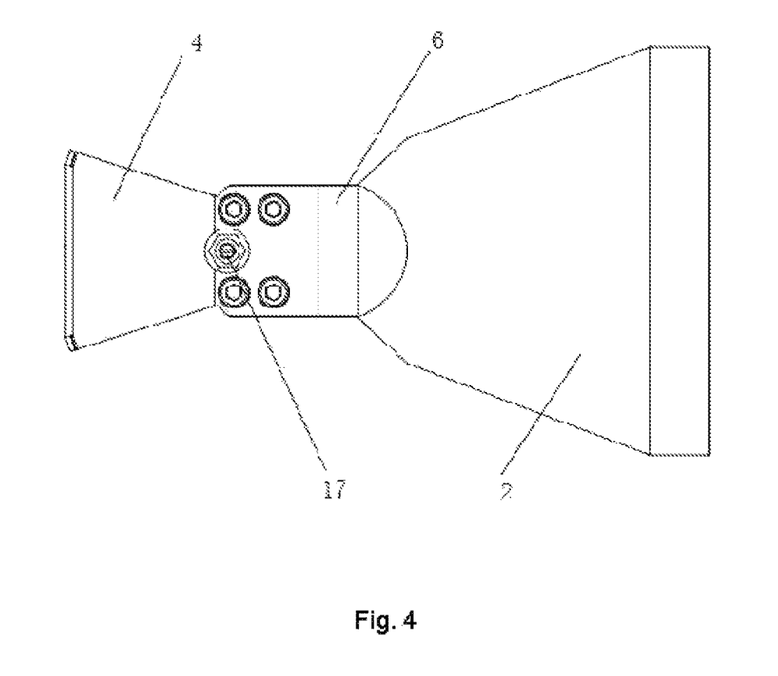
FIG. 4 illustrates an upward-view structural schematic diagram of a horn antenna of the embodiments of the present disclosure.
Figure 5:
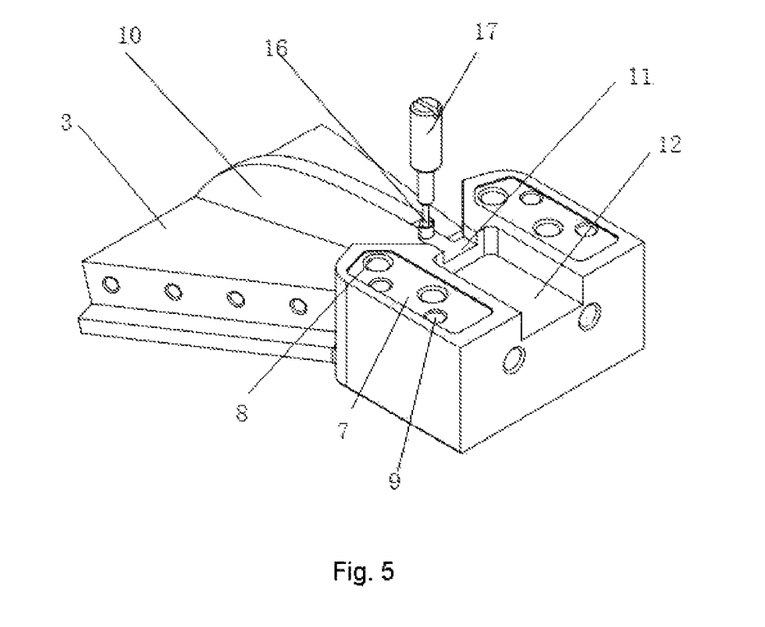
FIG. 5 illustrates a perspective structural schematic diagram of an upper plate in the horn antenna of the embodiments of the present disclosure.
Figure 6:
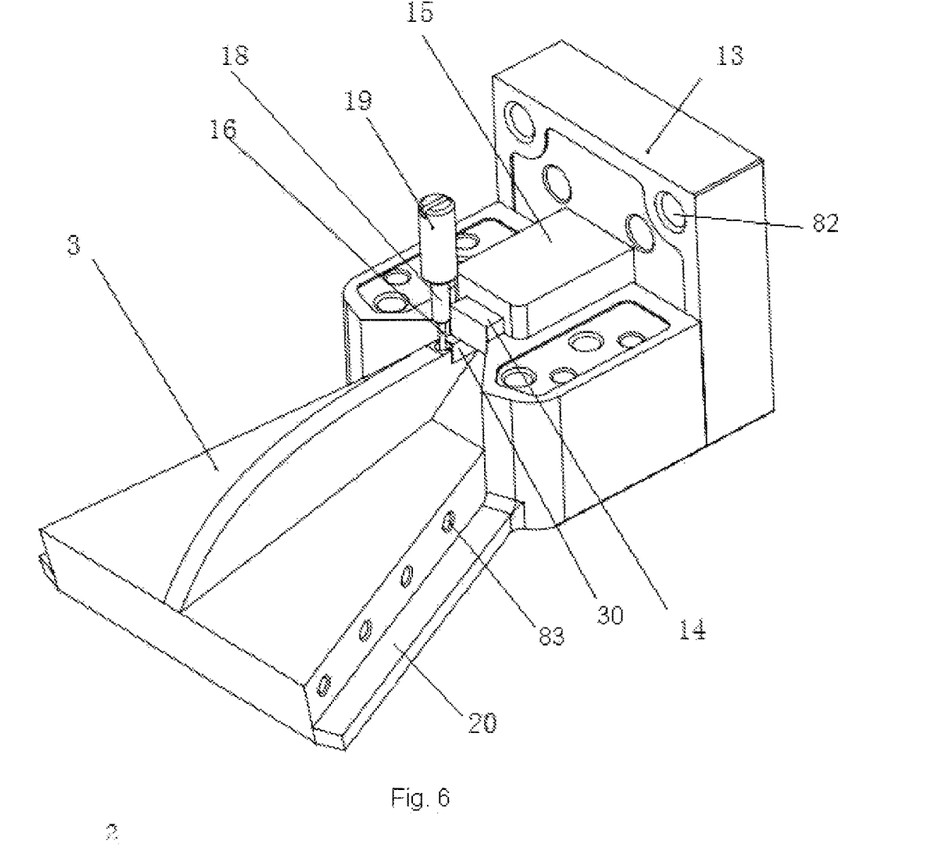
FIG. 6 illustrates a perspective structural schematic diagram of the upper plate in the horn antenna of the embodiments of the present disclosure.

In some embodiments, in order to make it convenient to mount the side plate 5, front and rear sides of the left part of the upper plate 3 are provided with bosses 20 extending outwards, and front and rear side surfaces, connected with the bosses 20, of the upper plate 3 are provided with at least one fourth threaded holes 83 separately; front and rear sides of the left part of the lower plate 4 are provided with bosses 20 extending outwards, and front and rear side surfaces, connected with the bosses 20, of the lower plate are provided with at least one fourth threaded holes 83 separately; and the side plate 5 is mounted with an aid of the fourth threaded hole 83.

Some embodiments of the present disclosure provided a horn antenna, including: a horn antenna body; a coaxial connector; and a mounting base, wherein the horn antenna body includes an upper plate, a lower plate, a side plate, a cover plate and mounting seats; mounting seats are formed on front and rear sides of the upper half cavity and the lower half cavity; wherein, an excitation cavity is disposed on ends, close to the cover plate, of the upper plate and the lower plate; mounting seats are disposed on ends, close to the cover plate, of the upper plate and the lower plate; an upper mounting groove is disposed on the upper plate and the mounting seat disposed on the upper plate; an lower mounting groove is disposed on the lower plate and the mounting seat disposed on the lower plate; a protrusion part is disposed on the cover plate, the upper mounting groove and the lower upper mounting groove form a mounting space, the protrusion part is disposed in the mounting space.

In some embodiments, the upper plate and the lower plate are provided with vertically-disposed curved ridges; a height of the curved ridge is gradually increased along a direction away from the cover plat.

In some embodiments, wherein each of the mounting seats is provided with a first threaded hole, the first threaded hole is penetrated through a corresponding mounting seat, each of the mounting seats is provided with a pin hole.

In some embodiments, wherein both opposite sides of the upper plate and the lower plate are provided with a side plate, an upper end of the side plate is fixedly connected with the upper plate, and a lower end of the side plate is fixedly connected with the lower plate.

In some embodiments, wherein the upper mounting groove and the lower mounting groove include a first mounting groove and a second mounting groove respectively, the first mounting groove is located on one side, away from the cover plate, of the second mounting groove, a width of the first mounting groove is smaller than a width of the second mounting groove; the protrusion part includes a first protrusion and a second protrusion, the first mounting groove of the upper mounting groove and the first mounting groove of the lower mounting groove form a mounting space for accommodating the first protrusion; the second mounting groove of the upper mounting groove and the second mounting groove of the lower mounting groove form a mounting space for accommodating the second protrusion.

In some embodiments, wherein the cover plate comprises the protrusion part and a connection part, the protrusion part is connected with the connection part, the protrusion part is located one side, close to the upper plate, of the connection part; the upper plate is provided with an upper half cavity, the lower plate is provided with a lower half cavity, an excitation cavity comprises the upper half cavity and the lower half cavity; a end surface, close to the upper plate, of the protrusion part, is a part of an inner wall surface of the excitation cavity.

In some embodiments, wherein a ridge curve of the curved ridge is satisfied a curve equation: $y=10^{\wedge}(a*x+b)+c*x$, y is a height of the ridge, x is a length of the ridge, and a, b and c are constants.

In some embodiments, wherein a value range of a is (0, 0.2), a value range of b is (−2, 0) and a value range of c is (0, 0.005).

In some embodiments, wherein each of the upper plate and the lower plate comprises a trapezoidal structure, a width of the trapezoidal structure are gradually increased along a direction away from the cover plate.

Figure 13:
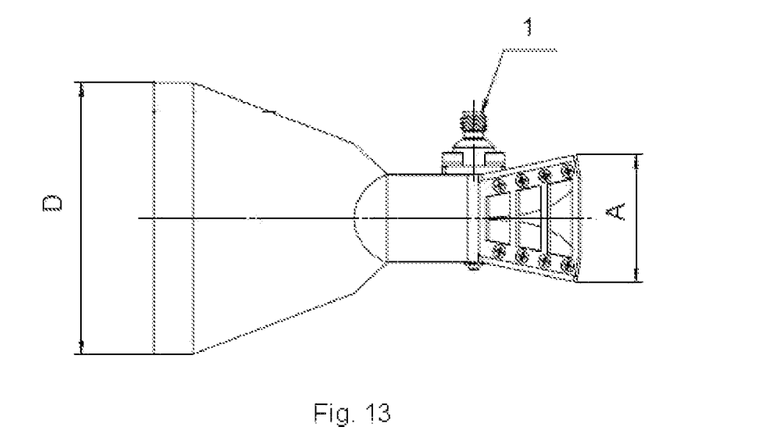
FIG. 13 illustrates a first dimensional diagram of the horn antenna the embodiments of the present disclosure.
Figure 14:
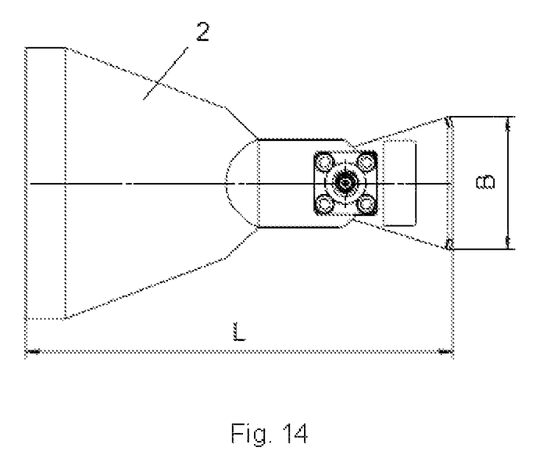
FIG. 14 illustrates a second dimensional diagram of the horn antenna the embodiments of the present disclosure.

In some embodiments, wherein an entire length L of the horn antenna is 65 mm, a diameter D of the mounting base is 41 mm and a size of a horn opening is 19 mm*20 mm (A*B).

The diameter of the mounting base 2 is a diameter of a end surface, away from the coaxial connector 1, of the mounting base 2; the size of a horn opening includes a length and a width of a end surface, away from the coaxial connector 1, of the horn antenna body.

Figure 9:
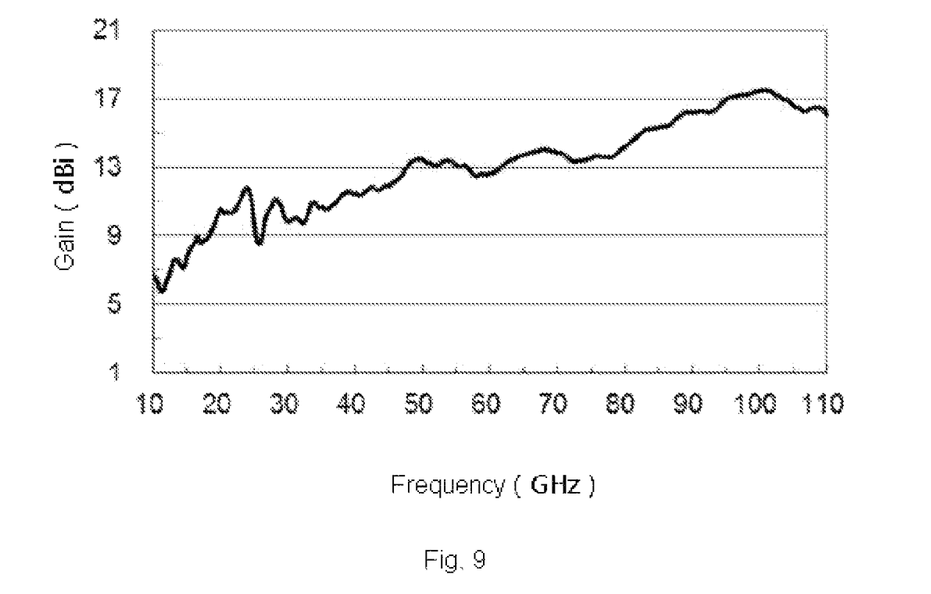
FIG. 9 illustrates a curve graph of a gain of the horn antenna of the embodiments of the present disclosure.
Figure 10:
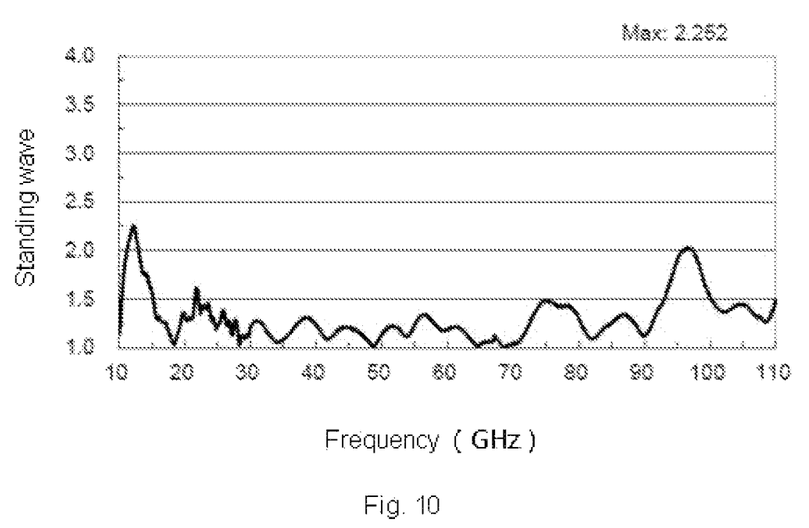
FIG. 10 illustrates a curve graph of a standing wave of the horn antenna of the embodiments of the present disclosure.
Figure 11:
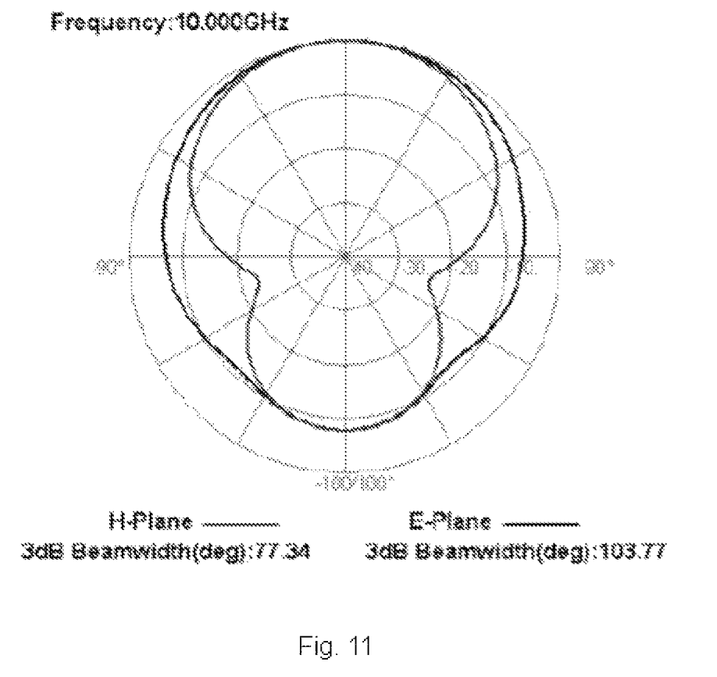
FIG. 11 illustrates a directional diagram of the horn antenna in 10 GHz of the embodiments of the present disclosure.
Figure 12:
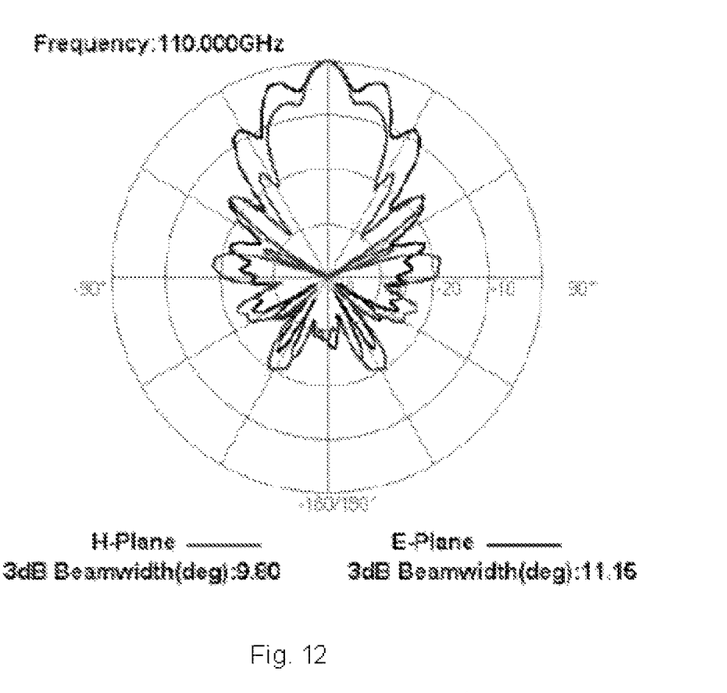
FIG. 12 illustrates a directional diagram of the horn antenna in 110 GHz of the embodiments of the present disclosure.

The antenna manufactured on the basis of the present embodiment is tested. FIG. 9 is a gain curve of this antenna, FIG. 10 is a standing wave curve of this antenna and FIGS. 11-12 are directional diagrams of the antenna in 10 GHz and 110 GHz separately. The antenna operates in an ultra-wide frequency band range of 10-110 GHz, has a high gain of 5-17 dBi, a voltage standing wave ratio in an entire band of less than 2.252 and excellent impedance matching, and is very suitable for the field of ultra-wideband test and measurement.

What is claimed is:

1. A miniaturized horn antenna suitable for ultra-wideband measurement, comprising:
a horn antenna body;
a coaxial connector; and
a mounting base, wherein the horn antenna body comprises an upper plate, a lower plate, a side plate and a cover plate, the upper plate and the lower plate are provided with ridges, the upper plate and the lower plate are in a symmetrical structure integrally and integrally formed separately, and both the upper plate and the lower plate comprise left parts and right parts, a right part of the upper plate and a right part of the lower plate form an upper half cavity and a lower half cavity respectively, the upper half cavity and the lower half cavity form an excitation cavity;
the miniaturized horn antenna further comprises mounting seats formed on front and rear sides of the upper half cavity and the lower half cavity, wherein at least one a first threaded holes is provided in the mounting seats separately, each of the at least one the first threaded holes is penetrated through a corresponding mounting seat, at least one pin hole is provided in a mounting seat disposed on the upper plate and a mounting seat disposed on the lower plate separately, an upper mounting groove is formed between the mounting seat disposed on the upper plate and the upper plate, a lower mounting groove is formed between the mounting seat disposed on the lower plate and the lower plate respectively, the upper mounting groove and the lower mounting groove jointly form a mounting space for arranging a protrusion part at a left end of the cover plate, the protrusion part is mounted in the mounting space, the cover plate is fixedly connected with right side surfaces of the upper plate and the lower plate, the left parts of the upper plate and the lower plate are in a trapezoidal structure integrally, widths of the left parts are gradually reduced from left to right, the left parts of the upper plate and the lower plate are provided with vertically-disposed curved ridges in an axial direction of an antenna, a height of the curved ridge is gradually reduced from left to right, at least one side plates is disposed between a front side of the upper plate and a front side of the lower plate and between a rear side of the upper plate and a rear side of the lower plate, an upper end of each of the at least one side plates is fixedly connected with the upper plate, and a lower end of each of the at least one side plate is fixedly connected with the lower plate; the coaxial connector is fixedly connected with the upper plate; and the mounting base fixes the cover plate on the upper plate and the lower plate.

2. The miniaturized horn antenna suitable for the ultra-wideband measurement as claimed in claim 1, wherein the upper mounting groove and the lower mounting groove comprise a first mounting groove located on a left side and a second mounting groove located on a right side respectively, a width of the first mounting groove is smaller than a width of the second mounting groove; the cover plate comprises the protrusion part located on the left side and a connection part located on the right side, the protrusion part comprises a first protrusion located on the left side and a second protrusion located on the right side, the first mounting groove of the upper mounting groove and the first mounting groove of the lower mounting groove form a mounting space for accommodating the first protrusion, the second mounting groove of the upper mounting groove and the second mounting groove of the lower mounting groove form a mounting space of the second protrusion, and front and rear sides of the connection part are provided with at least one second threaded hole; and positions, corresponding to the second threaded holes in the connection part, in the mounting base are also provided with a third threaded holes, and a bolt is passed through each of the third threaded holes in the mounting base and the each of the at least one second threaded hole in the connection part in sequence to fix the cover plate to the upper plate and the lower plate.

3. The miniaturized horn antenna suitable for the ultra-wideband measurement as claimed in claim 1, wherein a first central hole penetrating upper and lower sides of the upper plate is provided in one end, close to the mounting seat, of the curved ridge located on the upper plate, a second central hole penetrating upper and lower sides of the lower plate is provided in one end, close to the mounting seat, of the curved ridge located on the lower plate, the first central hole and the second central hole are oppositely disposed, one end of the coaxial connector is fixed on the upper plate and covers an opening in an upper end of the first central hole, the miniaturized horn antenna comprises a first central column located in the first central hole and a second central column located in the second central hole, wherein the first central column is not in contact with an inner wall of the first central hole, an upper end of the first central column is electrically connected with the coaxial connector, an upper end of the second central column is in contact with a lower end of the first central column, and a lower end of the second central column is fixed in the second central hole.

4. The miniaturized horn antenna suitable for the ultra-wideband measurement as claimed in claim 3, wherein the second central hole comprises an upper second central hole and a lower second central threaded hole, a diameter of the upper second central hole is smaller than a diameter of the lower second central threaded hole, and the second central column comprises an upper second central column and a lower second central threaded column, the upper second central column is cooperated with the upper second central hole, the lower second central threaded column is cooperated with the lower second central threaded hole, an upper end of the upper second central column is in direct contact with the lower end of the first central column, and a lower surface of the lower second central threaded column is provided with a slotted groove.

5. The miniaturized horn antenna suitable for the ultra-wideband measurement as claimed in claim 3, wherein a diameter of the first central column is less than 0.5 mm and a diameter of the second central hole is less than 1 mm.

6. The miniaturized horn antenna suitable for the ultra-wideband measurement as claimed in claim 1, wherein a ridge curve of the curved ridge is satisfied a curve equation: $y=10^{(a*x+b)}+c*x$, y is a height of the ridge, x is a length of the ridge, and a, b and c are constants.

7. The miniaturized horn antenna suitable for the ultra-wideband measurement as claimed in claim 6, wherein a value range of a is (0, 0.2), a value range of b is (−2, 0) and a value range of c is (0, 0.005).

8. The miniaturized horn antenna suitable for the ultra-wideband measurement as claimed in claim 1, wherein front and rear sides of a left part of the upper plate are provided with bosses extending outwards, and front and rear side surfaces, connected with the bosses, of the upper plate are provided with at least one fourth threaded holes separately; front and rear sides of a left part of the lower plate are provided with bosses extending outwards, and front and rear side surfaces, connected with the bosses, of the lower plate are provided with at least one fourth threaded holes separately; and the side plate is mounted with an aid of fourth threaded holes.

9. The miniaturized horn antenna suitable for the ultra-wideband measurement as claimed in claim 1, wherein an entire length of the horn antenna is 65 mm, a diameter of the mounting base is 41 mm and a size of a horn opening is 19 mm*20 mm.

10. The miniaturized horn antenna suitable for the ultra-wideband measurement as claimed in claim 1, wherein a range of operating frequencies of the horn antenna is 10 GHz-110 GHz.

11. A horn antenna, comprising:
a horn antenna body;
a coaxial connector; and
a mounting base, wherein the horn antenna body comprises an upper plate, a lower plate, a side plate, a cover plate and mounting seats; mounting seats are formed on front and rear sides of the upper half cavity and the lower half cavity;
wherein, an excitation cavity is disposed on ends, close to the cover plate, of the upper plate and the lower plate; mounting seats are disposed on ends, close to the cover plate, of the upper plate and the lower plate;
an upper mounting groove is disposed on the upper plate and the mounting seat disposed on the upper plate; an lower mounting groove is disposed on the lower plate and the mounting seat disposed on the lower plate;
a protrusion part is disposed on the cover plate, the upper mounting groove and the lower upper mounting groove form a mounting space, the protrusion part is disposed in the mounting space.

12. The horn antenna as claimed in claim 11, wherein, the upper plate and the lower plate are provided with vertically-disposed curved ridges; a height of the curved ridge is gradually increased along a direction away from the cover plat.

13. The horn antenna as claimed in claim 11, wherein each of the mounting seats is provided with a first threaded hole, the first threaded hole is penetrated through a corresponding mounting seat, each of the mounting seats is provided with a pin hole.

14. The horn antenna as claimed in claim 11, wherein both opposite sides of the upper plate and the lower plate are provided with a side plate, an upper end of the side plate is fixedly connected with the upper plate, and a lower end of the side plate is fixedly connected with the lower plate.

15. The horn antenna as claimed in claim 11, wherein the upper mounting groove and the lower mounting groove comprise a first mounting groove and a second mounting groove respectively, the first mounting groove is located on one side, away from the cover plate, of the second mounting groove, a width of the first mounting groove is smaller than a width of the second mounting groove; the protrusion part comprises a first protrusion and a second protrusion, the first mounting groove of the upper mounting groove and the first mounting groove of the lower mounting groove form a mounting space for accommodating the first protrusion; the second mounting groove of the upper mounting groove and the second mounting groove of the lower mounting groove form a mounting space for accommodating the second protrusion.

16. The horn antenna as claimed in claim 11, wherein the cover plate comprises the protrusion part and a connection part, the protrusion part is connected with the connection part, the protrusion part is located one side, close to the upper plate, of the connection part; the upper plate is provided with an upper half cavity, the lower plate is provided with a lower half cavity, an excitation cavity comprises the upper half cavity and the lower half cavity; a end surface, close to the upper plate, of the protrusion part, is a part of an inner wall surface of the excitation cavity.

17. The horn antenna as claimed in claim 12, wherein a ridge curve of the curved ridge is satisfied a curve equation: $y=10^{(a*x+b)}+c*x$, y is a height of the ridge, x is a length of the ridge, and a, b and c are constants.

18. The horn antenna as claimed in claim 17, wherein a value range of a is (0, 0.2), a value range of b is (−2, 0) and a value range of c is (0, 0.005).

19. The horn antenna as claimed in claim 11, wherein each of the upper plate and the lower plate comprises a trapezoidal structure, a width of the trapezoidal structure are gradually increased along a direction away from the cover plate.

20. The horn antenna as claimed in claim 11, wherein an entire length of the horn antenna is 65 mm, a diameter of the mounting base is 41 mm and a size of a horn opening is 19 mm*20 mm.

* * * * *